United States Patent
Kim et al.

(10) Patent No.: US 8,422,289 B2
(45) Date of Patent: Apr. 16, 2013

(54) FABRICATION METHOD OF NANOPARTICLES BY CHEMICAL CURING

(75) Inventors: Young-Ho Kim, Seoul (KR); Wenguo Dong, Seoul (KR); Gun-Hong Kim, Seoul (KR); Jun-Ro Yoon, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 1107 days.

(21) Appl. No.: 12/303,079

(22) PCT Filed: Jun. 5, 2007

(86) PCT No.: PCT/KR2007/002732
§ 371 (c)(1),
(2), (4) Date: Dec. 1, 2008

(87) PCT Pub. No.: WO2007/142457
PCT Pub. Date: Dec. 13, 2007

(65) Prior Publication Data
US 2009/0121272 A1 May 14, 2009

(30) Foreign Application Priority Data
Jun. 7, 2006 (KR) .................. 10-2006-0051031

(51) Int. Cl.
*G11C 11/34* (2006.01)

(52) U.S. Cl.
USPC ............ 365/185.01; 365/185.03; 365/185.29; 977/840; 977/943

(58) Field of Classification Search ............. 365/185.01, 365/185.03, 185.29; 977/840, 943
See application file for complete search history.

(56) References Cited

U.S. PATENT DOCUMENTS

| | | | |
|---|---|---|---|
| 5,690,807 | A | 11/1997 | Clark, Jr. et al. |
| 5,906,670 | A | 5/1999 | Dobson et al. |
| 6,294,223 | B1 | 9/2001 | Hampikian et al. |
| 6,689,468 | B2 | 2/2004 | Edelmann et al. |
| 6,699,586 | B2 | 3/2004 | Edelmann et al. |
| 6,830,816 | B2 | 12/2004 | Mehnert et al. |
| 6,831,310 | B1 * | 12/2004 | Mathew et al. ............... 257/270 |
| 7,110,299 | B2 * | 9/2006 | Forbes ..................... 365/185.18 |
| 7,259,984 | B2 * | 8/2007 | Kan et al. ...................... 365/177 |
| 7,262,991 | B2 * | 8/2007 | Zhang et al. ............. 365/185.01 |
| 8,093,648 | B2 * | 1/2012 | Cho et al. ...................... 257/317 |
| 2005/0100719 | A1 | 5/2005 | Kanakarajan et al. |
| 2005/0201149 | A1 * | 9/2005 | Duan et al. ............... 365/185.03 |
| 2006/0220094 | A1 * | 10/2006 | Lojek ............................ 257/315 |

FOREIGN PATENT DOCUMENTS
| | | |
|---|---|---|
| KR | 10-0379250 | 3/2003 |
| KR | 10-0488896 | 5/2005 |

* cited by examiner

*Primary Examiner* — Pho M Luu
(74) *Attorney, Agent, or Firm* — Dickstein Shapiro LLP

(57) ABSTRACT

A method of producing nanoparticles by using chemical curing. The method includes depositing a metal thin film on a substrate, applying an insulator precursor on a metal thin film, and adding a curing agent and a catalyst to the insulator precursor to perform the chemical curing. The method also includes mixing metal powder and an insulator precursor, applying a mixture on a substrate, and adding a curing agent and a catalyst to the mixture to perform the chemical curing. Since the chemical curing process is used in the method, it is possible to form nanoparticles by using a simple process at low cost while a high temperature process such as thermal curing is not used.

15 Claims, 5 Drawing Sheets

(a)

(b)

(a)

(b)

US 8,422,289 B2

FABRICATION METHOD OF NANOPARTICLES BY CHEMICAL CURING

TECHNICAL FIELD

The present invention relates to a method of forming nanoparticles using chemical curing and nanoparticles formed using the same.

BACKGROUND ART

If nanometer-sized particles constitute a substance, various physical properties such as mechanical, optical, electric, and magnetic properties may be improved as compared to a conventional substance. Additionally, a novel substance containing various types of nanoparticles may be created. Many studies have been performed in the preparation of nanosubstances, in order to produce nanoceramics, nanometal, and nanocomposites containing highly pure particles having the size in the range of 1 to 100 nm, at home and abroad. When highly pure and concentrated particles having a predetermined nanometer size are formed and then attached to a substrate or subjected to reaction sintering to produce a final substance, it is the core technology to control the particle having nonometer size—to control generation, growth, movement, and attachment of the particles. However, the current technology is not satisfactory. Thus, there is a need to avoid the above-mentioned problems.

In recent years, various types of processes of forming nanoparticles have been suggested, and a process of forming and growing nanoparticles on a substrate and a process of forming a multilayered thin film after nanoparticles are formed on a substrate or an insulator thin film or only in a specific region of the substrate have been used according to the position of produced particles. In this connection, various types of processes have been developed in order to form embedded quantum particles on a thin film or a substrate. With respect to known production processes, an effort has been made to obtain a desirable particle size and distribution state and minimize agglomeration by using a conventional sputter, evaporation deposition process, CVD process, and epitaxial process, and the known production processes have been improved to avoid the problems occurring during the processes (Korean Patent Application No. 2000-0072958, Composite Polymers Containing Nanometer-sized Metal Particles and Fabrication Method Thereof, Researcher in Korea Institute of Science and Technology). In addition, a gas-phase synthesis process using inert gas condensation using heat evaporation (Making particles of uniform size, Dobson et al., U.S. Pat. No. 5,906,670) caused by gasification of a precursor, microwave plasma, and laser ablation, and a chemical gas-phase condensation process in which a metal organic substance is decomposed or synthesized by using a combustion flame or a hot-wall reactor are extensively known. Furthermore, a typical air sol spraying process is applied to produce a material that contains metal/alloy, ceramic nanopowder, a coating or doping type nanocomposite powder, or nanoparticles which are directly sprayed on a substrate in a large amount and has a narrow density distribution at normal pressure or at a low vacuum pressure. However, this is disadvantageous in that it is difficult to precisely control a distribution state of particles and the thickness of the film formed by using the spraying. In respects to a process using an aqueous solution, there is a chemical method where agglomeration between fluorescent particles is prevented, a precursor is produced, and assembling and growing are performed by using nucleus growth (Method for producing semiconductor particles, Harry R. Clark, Jr., U.S. Pat. No. 5,690,807). The chemical method includes mixing an aqueous solution of a fluorescent raw material and an aqueous solution of a compound containing light-emitting metal in a solvent, precipitating the mixture, reacting the resulting mixture and a gas-phase fluorescent raw material by using heat treatment to produce fluorescent nanoparticles having light-emitting cores, and attaching the nanoparticles to a substrate. Currently, various types of methods are suggested (Method for ion implantation induced embedded particle formation via reduction, Hampikian et al., U.S. Pat. No. 6,294,223 B1). For example, an ion implantation process is applied to control an accelerating voltage and a temperature of a substrate, so that required metal particles are formed on the substrate and a particle size distribution thereof is precisely controlled. However, the known technologies are disadvantageous because of an increase in volume caused by agglomeration, sintering, and heat treatment of the nanoparticles during the production of the nanoparticles, the necessity for various types of catalysts and additives and the undesirable yield of produced particles. Further they require a complicated production process, a long time, and high cost for the manufacturing.

The gist of the above-mentioned conventional processes of forming nanoparticles and application thereof will be given below.

(i) In the conventional process of forming nanoparticles by using a CVD process, a PVD process, and a gas-phase evaporation process, nanoparticles are formed by using improved physical and chemical deposition processes, and the production of the nanoparticles is performed by using a conventional vacuum system. However, during the process, it is impossible to deposit a plurality of components due to limitations in respects to a reaction gas, and there is a high possibility of health issues to workers during the process.

(ii) In the process of forming the nanoparticles on the substrate in a reaction gas phase by using a liquid spraying process, polymer/metal nanoparticles may be formed on the substrate or sprayed on the substrate so that highly pure nanoparticles having low density and narrow distribution are formed, or polymer/metal nanoparticles having a size of 10 nm or less may be formed. However, it leaves a problem of overcoming the nonuniform distribution at the sprayed substrate.

(iii) The process of forming the particles having a nano size on the substrate after synthesis on the aqueous solution is a representative process using a bottom-up access process. In the process, a precursor is generated in an aqueous solution and is subjected to reaction assembling, and highly pure and ultrafine particles are formed by using particle assembling. However, it is necessary to avoid agglomeration of the produced ultrafine particles.

(iv) In the process of distributing the nanoparticles on the substrate by using the ion implantation process, the particles having a nano size are formed on the substrate by using a conventional ion implantation process. It is possible to obtain a precise profile of nanoparticles by using advantages of the ion implantation and it is possible to form nanoparticles having an ion-size region. However, there is a disadvantage in that equipment used during the process is costly.

In order to avoid the above-mentioned problems of the processes, a method of producing nanoparticles from ions of metal dissolved in an acidic insulator precursor by using thermal curing is suggested (Korean Patent No. 0488896, Method of forming quantum dots using a metal thin film). The above-mentioned patent discloses a method of producing nanoparticles which includes precipitating the nanoparticles in a polyimide thin film by using imidization due to thermal curing of polyamic acid containing metal dissolved therein. According to the method which is disclosed in the above-mentioned patent, the nanoparticles having the same size may be formed in a large area in the insulator precursor by using a simple process so as to reduce agglomeration. However, since the thermal curing includes increasing the temperature from 300 to 500° C., there are problems in that ambient devices may deteriorate during thermal curing, cost is increased, and agglomeration may occur between the particles activated at high temperatures.

With respect to chemical curing, U.S. Patent Application Publication No. 2005-0100719 (published on May 12, 2005, Multilayer substrates having at least two dissimilar polyimide layers, useful for electronics-type applications, and compositions relating thereto; Kanakarajan, Kuppsuamy, et al.) discloses a method of curing a plurality of polyamic acid layers having different glass transition temperatures ($T_g$) in the chip package field. There, chemical curing is performed to cure the polyamic acid. However, the curing process which is disclosed in the above-mentioned patent is performed at a high temperature of 150° C. or more, and the patent does not disclose the method of forming the nanoparticles by using the curing process.

DISCLOSURE

Technical Problem

It is an object of the present invention to provide a method of producing nanoparticles by using a chemical curing process, wherein said method does not include the high temperature curing process which is costly and is considered a disadvantage of a known process, thereby enabling to produce nanoparticles having a nano size and a uniform size distribution at normal temperature and at low cost.

It is another object of the present invention to provide a method of easily producing nanoparticles at low cost in an insulator precursor that is reacted with metal by using chemical curing.

It is still another object of the present invention to provide a method of controlling the size of the nanoparticles, which includes adjusting the curing time, the type of insulator precursor, and the amount of metal to be reacted.

Technical Solution

The present invention provides a method of producing nanoparticles by using chemical curing. The method includes (a) depositing a metal thin film on a substrate, (b) coating an insulator precursor on a metal thin film, and (c) adding a curing agent and a catalyst to the insulator precursor to perform chemical curing.

Furthermore, the present invention provides a method of producing nanoparticles by using chemical curing. The method includes (i) mixing metal powder and an insulator precursor, (ii) applying a mixture of the metal powder and the insulator precursor on a substrate, and (iii) adding a curing agent and a catalyst to the mixture of the metal powder and the insulator precursor on the substrate to perform the chemical curing.

Furthermore, the present invention provides a method of producing nanoparticles which further includes performing soft baking of the substrate in the range of 80 to 150° C. after step b or step ii.

Furthermore, the present invention provides a method of producing nanoparticles which further includes performing post heat treatment of the substrate in the range of 80 to 150° C. after step c or step iii.

Furthermore, the present invention provides a nanoparticle which is produced by using the method and is formed of a metal or metal oxide particle dispersed in a polymer thin film acting as an insulator.

Furthermore, the present invention provides an optical device or an electronic device that is produced by using nanoparticles dispersed in the polymer thin film.

The optical device uses a nano-size quantum confinement effect, and includes the polymer thin film containing the metal or metal oxide nanoparticles.

The electronic device uses a nano-size quantum confinement effect, and includes the polymer thin film containing the metal or metal oxide nanoparticles.

One embodiment of the present invention provides an optical device that includes a semiconductor substrate, the polymer thin film that is formed on the semiconductor substrate and contains the metal or metal oxide nanoparticle, and a conductive film formed on the polymer thin film.

Another embodiment of the present invention provides a nano floating flash memory device which includes a semiconductor substrate, a drain region, a source region, a floating gate, and a control gate. The floating gate is formed of nanoparticles dispersed in the polymer thin film.

Advantageous Effects

According to the present invention, nanoparticles are produced by means of a simple process using chemical curing. Since all steps of the process are performed in the temperature range of 100 to 150° C., high cost caused by a high temperature process can be avoided. It is a metal thin film or a metal powder that is reacted with an insulator precursor, thereby it is possible to apply it to a substrate having a desired shape. In addition, the nanoparticles of very high density can be formed on a large substrate. The size and density of the produced nanoparticles can be easily controlled by adjusting Curing time, the type of insulator precursor, and the amount of metal.

BEST MODE

A detailed description of the present invention will be given hereinafter.

1. Formation of Nanoparticles by Using Metal Thin Film and Chemical Curing (1) Preparation of Substrate A substrate is formed of a silicon wafer ($SiO_2$/Si, Si wafer) to perform observation by using an electron microscope and a glass substrate or quartz to evaluate optical characteristics. In order to remove impurities from a surface of the substrate, ultrasonic wave washing is performed by using acetone, deionized water, or methanol.

(2) Deposition of Metal Thin Film

A metal thin film is being deposited on the substrate. The thickness of the deposited metal thin film may depend on a required density of metal nanoparticles and reactivity of the insulator precursor. Preferably, the thickness is 50 nm or less.

The deposition of the metal thin film may be performed by using a chemical vapor deposition process, a physical vapor deposition process, or an electroplating process.

By adjusting the thickness of the metal thin film layer, the size or density of the produced nanoparticles can be controlled.

Metal forming the metal thin film may be selected from the group consisting of copper, zinc, tin, cobalt, iron, cadmium, lead, magnesium, barium, molybdenum, indium, nickel, tungsten, bismuth, manganese, and an alloy thereof.

Figure 1:
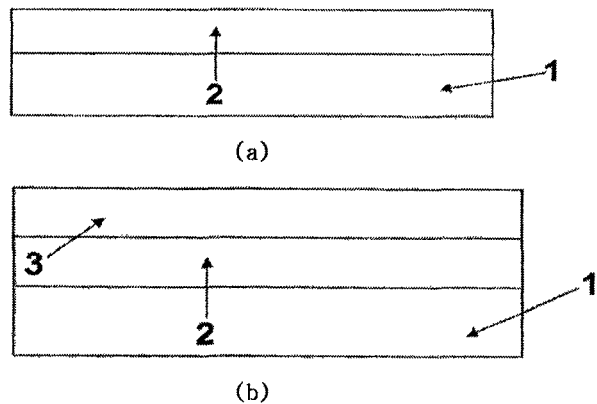
FIG. 1A illustrates deposition of a metal thin film layer 2 on a substrate 1.
FIG. 1B illustrates a reaction after an insulator precursor 3 is coated on the metal thin film layer 2 which is deposited on the substrate 1.

FIG. 1A illustrates deposition of a metal thin film layer 2 on a substrate 1.

(3) Coating of Insulator Precursor

The metal thin film is being coated by an insulator precursor. The insulator precursor is an acidic insulator precursor, preferably an acidic insulator precursor having a carboxy group (COOH—), and most preferably polyamic acid. Among various types of polyamic acids, a suitable specific polyamic acid is selected.

A process of applying the insulator precursor is not limited, but a typical application process may be performed. In particular, processes such as spin coating, jetting, spraying, printing, brushing, casting, blade coating, dispensing, and molding may be used.

The type of insulator precursor may be selected or the concentration of insulator precursor may be controlled to adjust reactivity in respects to metal. The concentration of insulator precursor may be controlled by adjusting a mixing ratio of the insulator precursor and a solvent. The solvent of the insulator precursor may be selected from N-methylpyrolidone (N-methyl-2-pyrrolidone), water, N-dimethylacetamide, and diglyme.

Additionally, in the case of when a mixture of the insulator precursor and the solvent is coated, the thickness of the thin film may be controlled to adjust the reactivity in respects to the metal.

(4) Soft Baking

After the insulator precursor is being coated on the metal thin film, the resulting film is maintained over a predetermined period of time so as to perform a reaction between the metal and the insulator precursor, and soft baking is performed in a dry oven in the range of 80 to 150° C. for 30 min to 1 hour, to remove the solvent.

FIG. 1B illustrates coating of the insulator precursor 3 on the metal thin film 2 on the substrate 1. In this state, the substrate is maintained for 1 to 24 hours so as to perform the reaction between the insulator precursor and the metal thin film.

(5) Chemical Curing

The Substrate/metal thin film/insulator precursor is being chemically cured. A curing agent and a catalyst are added to the insulator precursor formed on the metal thin film on the substrate to perform the chemical curing.

Examples of the curing agent may include aliphatic acidic anhydride or aromatic anhydride that acts as a dehydration agent. Specific examples of the aliphatic acidic anhydride may include compounds such as $(CH_3CO)_2O$, $(CH_3CH_2CO)_2O$, or $(CH_2CO)_2O$ and specific examples of the aromatic anhydride may include compounds such as $CH_3(C_6H_3)H_4(CO)_2O$ or $CH_3C_6H_3H_6(CO)_2O$.

The catalyst may be at least one selected from aliphatic tertiary amine, aromatic tertiary amine, and heterocyclic tertiary amine. Specific examples of the aliphatic tertiary amine compound may include $(C_2H_5)_3N$, specific examples of the aromatic tertiary amine compound may include $C_6H_5N(CH_3)_2$, and specific examples of the heterocyclic tertiary amine may include $C_5H_5N$, $C_6H_4(CH)_3N$, and $C_6H_5NH_2$.

A chemical curing time is not limited to a specific range, but is appropriately selected according to the type of insulator precursor.

It is preferable that a chemical curing process be performed at or below a temperature at which the curing agent and the catalyst are vaporized.

In respects to an atmosphere of the chemical curing process, it is preferable that the curing agent and the catalyst do not deteriorate due to the atmosphere.

After chemical curing is performed, post heat treatment is performed in the range of 80 to 150° C. to vaporize the curing agent and the catalyst, thereby stopping the curing.

The chemical curing time may be controlled to adjust the size or density of the nanoparticles.

Figure 3:
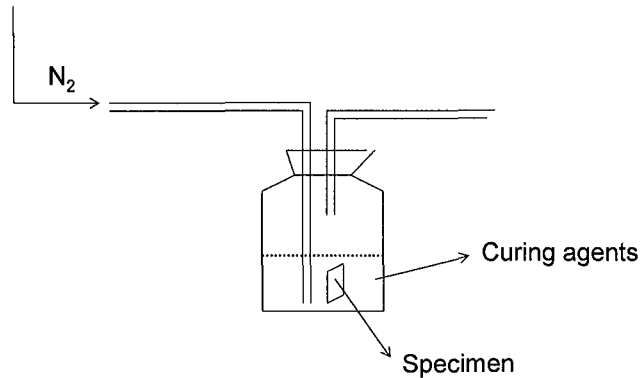
FIG. 3 illustrates addition of a curing agent and a catalyst to an insulator precursor 3 and the insulator precursor 6 containing metal powder dissolved therein which are reacted with the metal thin film layer 2 on the substrate so as to perform chemical curing, thus forming nanoparticles.

FIG. 3 illustrates the addition of the curing agent and the catalyst to the insulator precursor 3 which is reacted with the metal thin film layer 2 on the substrate so as to perform chemical curing, thus forming nanoparticles.

Figure 4:
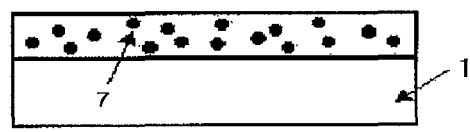
FIG. 4 illustrates formation of nanoparticles 7 on the substrate 1 by using chemical curing.

FIG. 4 illustrates formation of metal or metal oxide nanoparticles 7 between the insulators by using chemical curing.

2. Formation of Nanoparticles by Using Metal Powder and Chemical Curing (1) Preparation of Substrate A substrate is formed of a silicon wafer ($SiO_2$/Si, Si wafer) to perform observation by using a TEM (Transmission Electron Microscopy) and a glass substrate or quartz to evaluate optical characteristics. In order to remove impurities from a surface of the substrate, ultrasonic wave washing is performed by using acetone, deionized water, or methanol.

(2) Mixing of Metal Powder and Insulator Precursor

The metal powder that is capable of being reacted with the insulator precursor is mixed with the insulator precursor diluted with a solvent and then agitated. An additional agitation may be performed so as to desirably react the metal powder and the insulator precursor. The temperature and the time of the additional agitation are not limited, but may be appropriately selected according to the type of metal powder and insulator precursor. Preferably, the agitation is performed at normal temperature for 5 min to 24 hours.

The metal powder that is capable of being used in the present invention is pure metal powder or a metal powder alloy of the pure metal. Specific examples of metal or the alloy may include copper, zinc, tin, cobalt, iron, cadmium, lead, magnesium, barium, molybdenum, indium, nickel, tungsten, bismuth, manganese, and an alloy thereof. The size of particle constituting the powder is not limited but depends on the reactivity in respects to the insulator precursor. However, it is preferable that the size be 1 μm or less.

The amount of metal powder that is used to perform the mixing is not limited to a specific range. Since the nanoparticles are formed by the reaction of the metal and the insulator precursor, the amount of metal powder may be controlled to adjust the density of the nanoparticles. For example, if the amount of metal powder is increased, the density of the nanoparticles is increased.

The above insulator precursor is the same as the insulator precursor that is used in the method of forming the nanoparticles by using the metal thin film and the chemical curing and is capable of being reacted with the metal to precipitate the metal or metal oxide nanoparticles. The insulator precursor is an acidic insulator precursor, and preferably an acidic insulator precursor having a carboxyl group (—COOH). Most preferably, the insulator precursor is polyamic acid.

The solvent that is used to dilute the insulator precursor is appropriately selected according to the type of insulator precursor, and preferably at least one selected from N-methylpyrolidone, water, N-dimethylacetamide, and diglyme.

Figure 2:
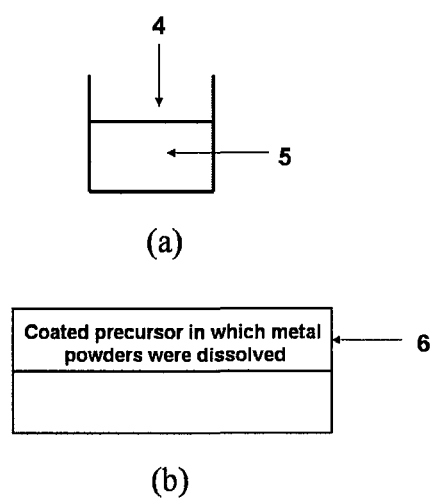
FIG. 2A illustrates agitation and dissolution after metal powder 4 and an insulator precursor 5 are mixed.
FIG. 2B illustrates application of an insulator 6 containing metal dissolved therein on a substrate.

FIG. 2A illustrates agitation and dissolution after the metal powder 4 and the insulator precursor 5 are mixed.

(3) Application of Insulator Precursor Containing Metal Powder Dissolved Therein on Substrate An insulator precursor solution containing the metal powder dissolved therein is applied on the substrate. In this process, since a liquid material is applied, any one of spin coating, jetting, spraying, printing, brushing, casting, blade coating, dispensing, and molding may be used as the application process. In the above-mentioned application process, it is possible to apply the material on an uneven surface as well as a plane surface of the substrate. In the case of when the jetting process and the dispensing process are used, it is possible to form the nanoparticles only on a selected portion.

FIG. 2B is a sectional view that illustrates application of the insulator precursor containing metal powder dissolved therein on the substrate.

(4) Soft Baking

The substrate on which the insulator precursor solution containing the metal powder dissolved therein is applied is subjected to soft baking at 80 to 150° C. The solvent is vaporized by the soft baking to increase viscosity of a polymer. Thus, movement of ions is restricted.

(5) Chemical Curing

The chemical curing agent and the catalyst are added to the insulator precursor that contains the metal dissolved therein and is subjected to the soft baking to perform the chemical curing. A specific process of performing chemical curing is the same as that described at (5) Chemical curing under 1. Formation of nanoparticles by using metal thin film and chemical curing.

3. Electronic Device and Optical Device Including Nanoparticles Dispersed in Insulator (1) Characteristics of Metal Nanoparticles A polymer thin film containing the nanoparticles of the present invention dispersed therein allows surface plasmon to occur thereon. The surface plasmon refers to vibration of electrons of the surface of metal that are excited when light is incident on the surface of the metal from the outside. A surface plasmon wave is formed due to mass vibration of the plasmon. A specific structure that causes the plasmon includes metals such as gold, silver, copper, and aluminum which easily emit electrons due to an external stimulus and has a negative dielectric constant and a medium (for example, polyimide) which has a positive dielectric constant and surrounds the metals. The movement distance of the surface plasmon wave moves on the surface of the metal depends on a specific wavelength band at which plasmon is resonant, and the wavelength band depends on the size and the shape of particle and dielectricity of the ambient medium (polyimide).

(2) Characteristics of Metal Oxide Nanoparticles

The metal oxide nanoparticles that are formed by using the process of the present invention may be applied to devices of electronic parts or optical parts using a quantum confinement effect in respects to the nano size. The quantum confinement effect occurs in the case of when a bulk semiconductor is affected by a boundary condition while being reduced to nano size and electrons move at a predetermined wavelength by energy corresponding to the wavelength. The quantum dot having a 0 dimension is three-dimensionally confined and an energy state thereof is discontinuous in comparison with the bulk semiconductor. In addition, energy of a bottom state is increased and band gap energy of the semiconductor is increased. The increase in band gap energy depends on the size of the particle and an effective mass of electrons or holes in atoms, and the size of the nanoparticle may be controlled to allow absorption to occur only at a specific wavelength region. In a specific structure that causes the quantum confinement effect, sizes of all bulk semiconductor substances are reduced to realize a quantum effect.

Representative examples of a device using the quantum confinement effect of the metal or metal oxide nanoparticles include an electronic device and an optical device.

(3) Example of Electronic Device: Nano Floating Flash Memory Device

In the case of when a nano floating gate of a next generation memory device such as a flash memory device is formed, a process of producing a substance that is capable of realizing confinement of electrons in nano crystals because the electrons are transmitted through the substrate at normal temperature and low pressure and a process of simply controlling the size or density of nanoparticle are required.

According to the production method of the present invention, there are advantages in that the nanoparticles are easily produced in the insulator due to chemical bonding of the insulator precursor and the metal, the nano floating gate is produced by using the nanoparticles formed using the method, and the flash memory device including the same has electric and chemical stabilities. Furthermore, according to the production method of the present invention, the flash memory device is very efficiently produced at low cost.

Figure 5:
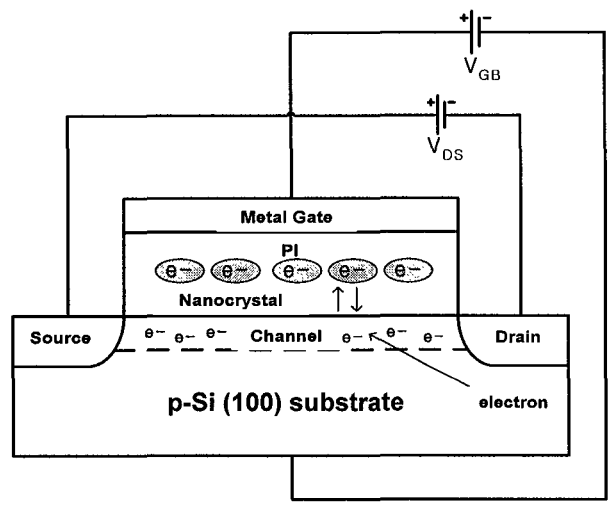
FIG. 5 illustrates a nano floating flash memory device using nanoparticles that are dispersed in polyimide formed according to the method of the present invention.

FIG. 5 illustrates a nano floating flash memory device using nanoparticles that are dispersed in polyimide formed according to the method of the present invention. The memory device includes a semiconductor substrate having an active region, a drain region and a source region that are spaced apart from each other on the substrate, a floating gate that is formed on a channel region between the drain region and the source region to be adjacent to the source region and includes nanoparticles (nano crystals) in a polymer thin film, and a control gate (metal gate) that is formed on the floating gate and electrically isolated by the polymer thin film. The nanoparticles may be formed in the polymer thin film to constitute a single layer or multi-layers.

(4) Optical Device

Figure 6:
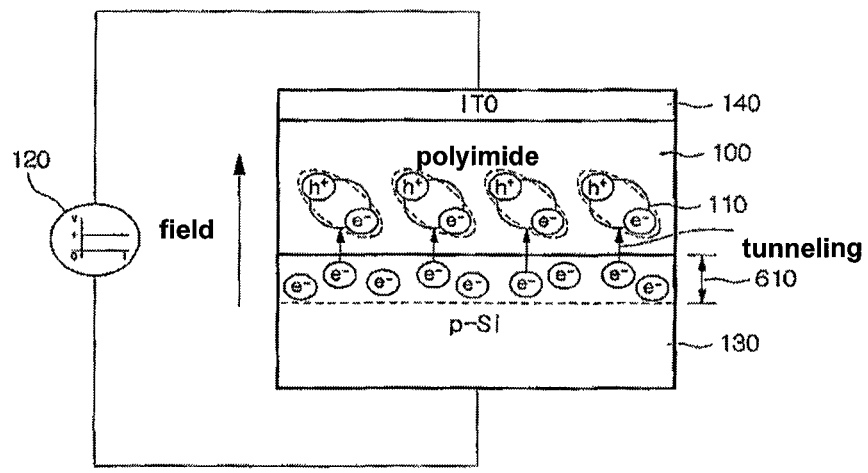
FIGS. 6 and 7 illustrate an optical device using a polyimide thin film in which nanoparticles formed according to the present invention are dispersed.
Figure 7:
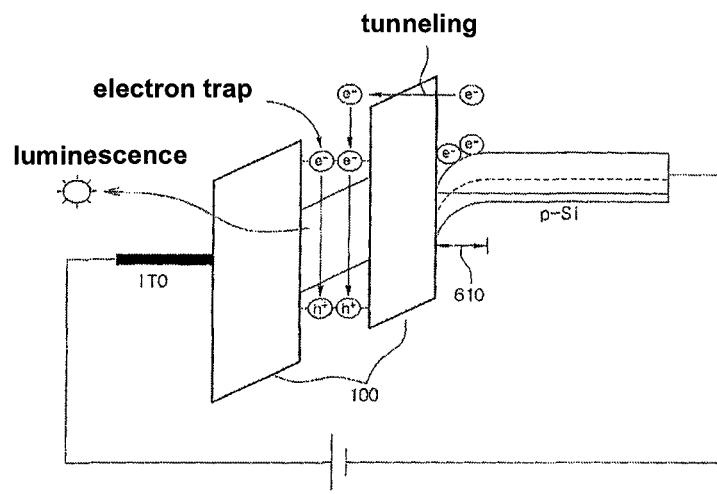

FIGS. 6 and 7 illustrate an optical device using a polyimide thin film in which nanoparticles formed according to the method of the present invention are dispersed.

A conductive film is formed in polyimide containing the nanoparticles and voltage is applied to induce dipoles to the nanoparticles. Recombination of electrons (e−) and holes (h+) occurs due to the dipoles, causing light emission. The nanoparticles may be formed in the polymer thin film to constitute a single layer or multi-layers.

MODE FOR INVENTION

A better understanding of the present invention may be obtained in light of the following Examples which are set forth to illustrate, but are not to be construed to limit the present invention.

EXAMPLE 1

Formation of Copper-Based Nanoparticles by Using Chemical Curing

1. First Process: Preparation of Substrate

An electron microscope nanoparticle specimen to observe the nanoparticles by using an electron microscope and a nanoparticle specimen to evaluate optical characteristics were produced. In the case of the electron microscope specimen, the silicon wafer ($SiO_2$/Si, Si wafer) was used. In the case of the specimen for evaluating the optical characteristics, the glass substrate or quartz having the size of 2×2 cm was used. Before an initial metal thin film is deposited, the specimens were subjected to ultrasonic wave washing by using trichloroethylene (TCE), acetone, and methanol for 5 min to chemically remove organic substances and impurities from the surfaces of the specimens. During the washing, the substrates were spaced apart from each other so as to prevent the surfaces thereof from being attached to each other. After the ultrasonic wave washing process was finished, final washing was performed by using deionized water and water was completely removed from the surfaces of the specimens by using nitrogen gas.

2. Second Process: Deposition of Copper Thin Film

The copper thin film was produced by using a thermal evaporator. The copper thin film was deposited on the substrate in a vacuum of 0.4 Pascal or less to a thickness of 5 nm.

3. Third Process: Application of Insulator Precursor

BPDA (Biphenly dianhydride)-PDA (Paraphenylene diamine) polyamic acid (PI-2610D, Dupont) that acted as the low dielectric constant substance and was manufactured by Dupont Co. was used as the insulator precursor. The polyamic acid that was the precursor of polyimide was dissolved in the NMP (N-methyl-2-pyrrolidone) solvent in content of 2.5 wt % and applied on the surface on which the metal thin film was deposited by using a spin coating process. The spin coating was performed through two steps. The first step of the spin coating was performed at 500 rpm for 10 sec and the second step was performed at 3000 rpm for 30 sec to conduct uniform application in respects to the entire specimen. The specimen in which the polyamic acid was applied on the metal thin film was maintained at normal temperature for 24 hours to perform desirable reaction between the polyamic acid and the metal thin film.

4. Fourth Process: Soft Baking

The substrate/copper thin film (5 nm)/polyamic acid (PAA) was maintained in a dry oven at 135° C. for 30 min to perform soft baking, thereby desirably removing the solvent from the polyamic acid.

5. Fifth Process: Chemical Curing

The curing agent and the catalyst were added to the substrate/copper thin film (5 nm)/PAA. Acetic anhydride was used as the curing agent and triethyl amine was used as the catalyst.

6. Sixth Process: Post Heat Treatment (Post Baking)

In order to finish curing, after 24 hours, the substrate in which the curing agent and the catalyst were added to polyimide was subjected to post heat treatment in an oven at 90° C. for 30 min so that the curing agent and the catalyst were desirably removed to finish the curing.

7. Analysis of Test Results

Figure 8:
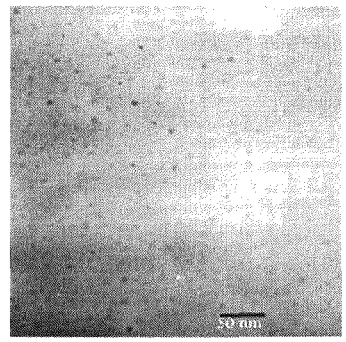
FIG. 8 is a transmission electron microscope plane picture that illustrates copper-based nanoparticles formed after a copper (Cu) thin film is deposited to a thickness of 5 nm to perform chemical curing.

FIG. 8 is a transmission electron microscope plane picture that illustrates copper-based nanoparticles formed after a copper thin film is deposited to a thickness of 5 nm to perform chemical curing. From FIG. 8, it could be seen that copper or copper oxide nanoparticles were uniformly dispersed in the polyimide thin film.

Figure 10:
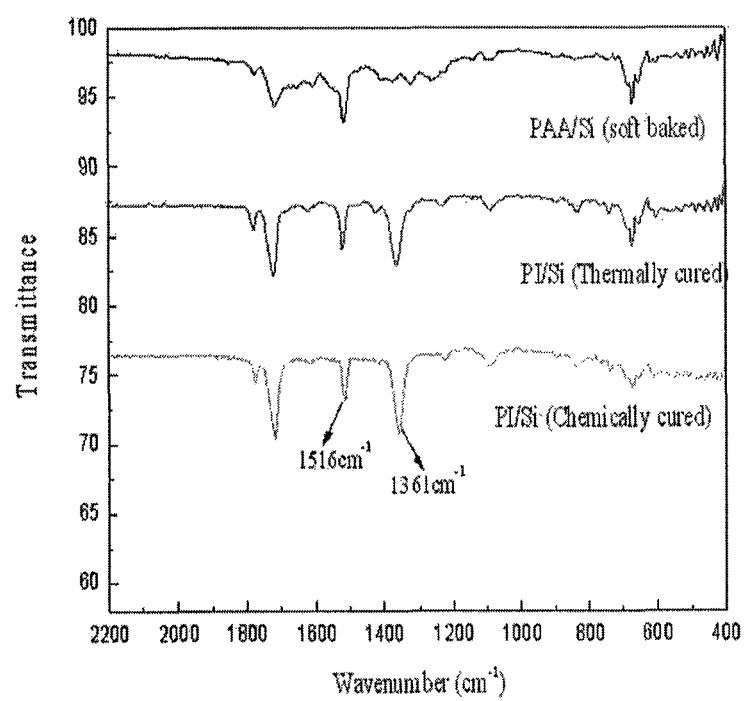
FIG. 10 is a graph that illustrates FT-IR measurement results in respects to conversion of polyamic acid into polyimide due to chemical curing.

FIG. 10 illustrates FT-IR analysis results of polyimide after chemical curing. From FIG. 10, it could be seen that the polyamic acid was imidized by using chemical curing to be converted into polyimide like the case of thermal curing.

EXAMPLE 2

Formation of Zinc-Based Nanoparticles by Using Chemical Curing

1. First Process: Preparation of Substrate

The substrate was prepared by using the same process as the first process of Example 1.

2. Second Process: Deposition of Zinc Thin Film

The zinc thin film was produced by using sputter. The zinc thin film was deposited on the substrate to a thickness of 10 nm.

3. Third Process: Application of Polyamic Acid

Like the third process of Example 1, polyamic acid (PAA) was selected as the insulator precursor. The polyamic acid that was dissolved in the NMP solvent was applied on the zinc thin film formed on the substrate by using a spin coating process.

4. Fourth Process: Soft Baking

The substrate/zinc thin film (10 nm)/PAA was maintained in a dry oven at 135° C. for 30 min to desirably remove the solvent from the polyamic acid.

5. Fifth Process: Chemical Curing

The substrate/zinc thin film (10 nm)/PAA was subjected to chemical curing at normal temperature by using the same process as the fifth process of Example 1. Acetic anhydride was used as the curing agent and triethyl amine was used as the catalyst.

6. Sixth Process: Post Heat Treatment

In order to finish curing, after 24 hours, the substrate 1 in which the curing agent and the catalyst were added to polyimide was subjected to post heat treatment in an oven at 90° C. for 30 min so that the curing agent and the catalyst were vaporized to be desirably removed.

7. Analysis of Test Results

Figure 9:
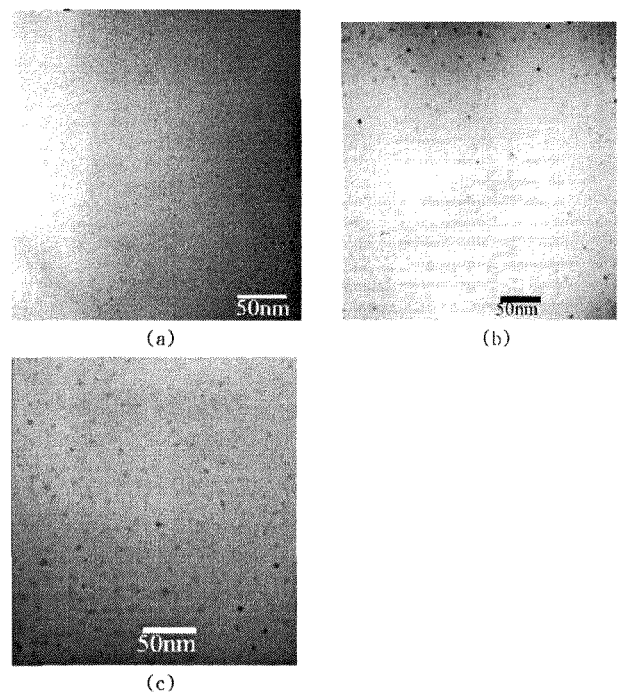
FIGS. 9A, 9B, and 9C are transmission electron microscope plane pictures that illustrate zinc-based nanoparticles formed after a zinc (Zn) thin film is deposited to a thickness of 10 nm to perform chemical curing for 1, 8, and 24 hours.

FIGS. 9A, 9B, and 9C are transmission electron microscope plane pictures that illustrate zinc-based nanoparticles formed after a zinc (Zn) thin film is deposited to a thickness of 10 nm to perform chemical curing for 1, 8, and 24 hours. From FIGS. 9A, 9B, and 9C, it could be seen that zinc or zinc oxide nanoparticles were uniformly dispersed in the polyimide thin film. Through the above results, it can be seen that it is possible to adjust the size of the nanoparticle by controlling the chemical curing time. In addition, FIG. 10 illustrates FT-IR analysis results of polyimide after chemical curing.

From FIG. 10, it could be seen that the polyamic acid was imidized by using chemical curing to be converted into polyimide like in the case of thermal curing.

EXAMPLE 3

Formation of Copper-Based Nanoparticles by Using Copper Powder

1. First Process: Shaping of Polyamic Acid Containing Copper Powder

Copper powder having an average particle size of 1 μm and BPDA-PDA (Biphenyltetracarboxylic dianhydride-phenylenediamine) polyamic acid that acted as the insulator precursor and was diluted in the NMP solvent were mixed with each other and then agitated. The mixture was left at normal temperature for 24 hours to be desirably reacted. The reacted polyamic acid insulator precursor solution where the copper powder was dissolved was thinly applied on the substrate that was subjected to ultrasonic wave washing by using trichloroethylene, acetone, or methanol for 5 min by means of a spin coating process.

2. Second Process: Soft Baking

The substrate on which the mixture of the copper powder and the polyamic acid was applied was subjected to soft baking at 100° C. for 30 min.

3. Third Process: Chemical Curing

The substrate on which the polyamic acid was formed was subjected to chemical curing by using the same process as the fifth process of Example 1.

4. Fourth Process: Post Heat Treatment

In order to finish curing, after 24 hours, the substrate 1 which was subjected to curing was subjected to post heat treatment in an oven at 90° C. for 30 min so that the curing agent and the catalyst were desirably removed.

The invention claimed is:

1. A method of producing nanoparticles by using chemical curing, comprising:
   (a) depositing a metal thin film on a substrate;
   (b) applying an insulator precursor on a metal thin film; and
   (c) adding a curing agent and a catalyst to the insulator precursor to perform the chemical curing,
   wherein the insulator precursor is dissolved in a solvent to control a concentration in step b.

2. A method of producing nanoparticles by using chemical curing, comprising:
   (i) mixing metal powder and an insulator precursor;
   (ii) applying a mixture of the metal powder and the insulator precursor on a substrate; and
   (iii) adding a curing agent and a catalyst to the mixture of the metal powder and the insulator precursor on the substrate to perform the chemical curing,
   wherein the insulator precursor is dissolved in a solvent to control a concentration in step i.

3. The method of producing nanoparticles according to claim 1 or 2, further comprising performing soft baking of the substrate in a range of 80 to 150° C. after step b or step ii.

4. The method of producing nanoparticles according to claim 1 or 2, further comprising performing post heat treatment of the substrate in a range of 80 to 150° C. after step c or step iii.

5. The method of producing nanoparticles according to claim 1 or 2, wherein the curing agent is at least one selected from aliphatic acidic anhydride and aromatic anhydride, and the catalyst is at least one selected from aliphatic tertiary amine, aromatic tertiary amine, and heterocyclic amine.

6. The method of producing nanoparticles according to claim 5, wherein the curing agent is at least one selected from the group consisting of $(CH_3CO)_2O$, $(CH_3CH_2CO)_2O$, $(CH_2CO)_2O$, $CH_3(C_6H_3)H_4(CO)_2O$, and $CH_3C_6H_3H_6(CO)_2O$, and the catalyst is at least one selected from the group consisting of $(C_2H_5)_3N$, $C_6H_5N(CH_3)_2$, $C_5H_5N$, $C_6H_4(CH)_3N$, and $C_6H_5NH_2$.

7. The method of producing nanoparticles according to claim 1 or 2, wherein the insulator precursor is an acidic insulator precursor having a carboxyl group (—COOH).

8. The method of producing nanoparticles according to claim 7, wherein the acidic insulator precursor is polyamic acid.

9. The method of producing nanoparticles according to claim 1, wherein the solvent is at least one selected from the group consisting of N-methylpyrolidone, water, N-dimethylacetamide, and diglyme.

10. The method of producing nanoparticles according to claim 1 or 2, wherein in at least one of:
    a thickness of a metal thin film,
    an amount of metal powder,
    a type and a concentration of insulator precursor, and
    a curing time is controlled to adjust a size or a density of the nanoparticles.

11. A nanoparticle produced by using the method according to claim 1 or 2, said nanoparticle being a metal or metal oxide particle dispersed in a polymer thin film acting as an insulator.

12. An optical device using a nano-size quantum confinement effect, comprising the polymer thin film containing the metal or metal oxide nanoparticle according to claim 11.

13. An electronic device using a nano-size quantum confinement effect, comprising the polymer thin film containing the metal or metal oxide nanoparticle according to claim 11.

14. The optical device according to claim 12, further comprising:
    a semiconductor substrate on which the polymer thin film is formed; and
    a conductive film formed on the polymer thin film.

15. A nano floating flash memory device which comprises a semiconductor substrate, a drain region, a source region, a floating gate, and a control gate, wherein the floating gate is formed of nanoparticles dispersed in the polymer thin film according to claim 11.

* * * * *